USO10032771B2

United States Patent
Sun et al.

(10) Patent No.: US 10,032,771 B2
(45) Date of Patent: *Jul. 24, 2018

(54) INTEGRATED CIRCUITS WITH CAPACITORS AND METHODS FOR PRODUCING THE SAME

(71) Applicant: Globalfoundries Singapore Pte. Ltd., Singapore (SG)

(72) Inventors: Yuan Sun, Singapore (SG); Shyue Seng Tan, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/479,507

(22) Filed: Apr. 5, 2017

(65) Prior Publication Data

US 2017/0358574 A1 Dec. 14, 2017

Related U.S. Application Data

(63) Continuation-in-part of application No. 15/181,446, filed on Jun. 14, 2016, now Pat. No. 9,646,963.

(51) Int. Cl.
| | |
|---|---|
| *H01L 21/00* | (2006.01) |
| *H01L 23/52* | (2006.01) |
| *H01L 27/08* | (2006.01) |
| *H01L 29/94* | (2006.01) |
| *H01L 23/535* | (2006.01) |
| *H01L 21/8234* | (2006.01) |
| *H01L 27/12* | (2006.01) |

(Continued)

(52) U.S. Cl.
CPC .. *H01L 27/0811* (2013.01); *H01L 21/823437* (2013.01); *H01L 21/823475* (2013.01); *H01L 21/84* (2013.01); *H01L 23/535* (2013.01); *H01L 27/0629* (2013.01); *H01L 27/0805* (2013.01); *H01L 27/1203* (2013.01); *H01L 28/40* (2013.01); *H01L 29/94* (2013.01)

(58) Field of Classification Search
CPC ............ H01L 27/0811; H01L 27/1203; H01L 21/823437; H01L 21/823475; H01L 21/84; H01L 23/535; H01L 29/94
See application file for complete search history.

(56) References Cited

U.S. PATENT DOCUMENTS

| | | |
|---|---|---|
| 4,249,494 A | 2/1981 | Guipaud |
| 5,111,355 A | 5/1992 | Anand et al. |

(Continued)

OTHER PUBLICATIONS

Taiwan Intellectual Property Office, Examination Report and Search Report for Taiwanese Patent Application No. 105122022, dated May 22, 2017.

*Primary Examiner* — Nicholas Tobergte
(74) *Attorney, Agent, or Firm* — Lorenz & Kopf, LLP

(57) ABSTRACT

Integrated circuits and methods of producing the same are provided. In an exemplary embodiment, an integrated circuit includes a first capacitor with a first gate overlying a first gate dielectric that in turn overlies a first channel. a second capacitor includes a second gate overlying a second gate dielectric that in turn overlies a second channel. The second gate dielectric has a different composition than the first gate dielectric. A capacitor interconnect is in electrical communication with the first capacitor and with the second capacitor.

20 Claims, 8 Drawing Sheets

(51) Int. Cl.
*H01L 21/84* (2006.01)
*H01L 27/06* (2006.01)
*H01L 49/02* (2006.01)

(56) References Cited

U.S. PATENT DOCUMENTS

| | | |
|---|---|---|
| 6,121,778 A | 9/2000 | Moore |
| 9,646,963 B1* | 5/2017 | Sun .................... H01L 27/0629 |
| 2002/0132412 A1* | 9/2002 | Mathew .......... H01L 21/823842 |
| | | 438/210 |
| 2006/0237726 A1 | 10/2006 | Iwamatsu et al. |
| 2009/0090948 A1* | 4/2009 | Sato .................... H01L 27/105 |
| | | 257/296 |
| 2010/0266153 A1 | 10/2010 | Gobeli et al. |
| 2016/0112011 A1 | 4/2016 | Kumar |

* cited by examiner

INTEGRATED CIRCUITS WITH CAPACITORS AND METHODS FOR PRODUCING THE SAME

This application is a continuation-in-part of U.S. application Ser. No. 15/181,446, filed Jun. 14, 2016.

TECHNICAL FIELD

The technical field generally relates to integrated circuits with capacitors and methods of producing the same, and more particularly relates to integrated circuits with two or more capacitors connected in parallel and methods of producing the same.

BACKGROUND

The semiconductor industry is continuously moving toward the fabrication of smaller and more complex microelectronic components with higher performance. The production of smaller integrated circuits requires the development of smaller electronic components, and closer spacing of those electronic components within the integrated circuits. Some integrated circuits include fully depleted semiconductor-on-insulator (FDSOI) substrates that have advantages over substrates that do not include a fully depleted channel, such as reduced short channel effects and reduced parasitic capacitances for transistors. These integrated circuits may utilize a semiconductor-on-insulator (SOI) substrate that has a shallow active layer overlying a buried insulator layer.

Capacitors may be formed using a FDSOI where the capacitor includes an electrically conductive gate and a channel that are separated by an insulating gate dielectric. The capacitance of a capacitor increases with decreased thickness of the dielectric material separating the two conductive materials, and high capacitance is desirable for some functions. Metal/oxide/metal (MOM) capacitors can be formed during back-end-of-the-line (BEOL) processes, but these MOM capacitors typically have relatively thick insulating oxide layers separating the conductive metal layers, which results in a low capacitance.

Capacitors formed earlier in the integrated circuit manufacturing process typically include a conductive gate and channel separated by an insulating gate dielectric, as described above. However, the capacitance of such capacitors tends to vary significantly with an applied voltage. In particular, when the applied voltage changes across certain thresholds, the channel changes from an inversion mode to a depletion mode, where portions of the channel act like an electrical insulator in the depletion mode. The capacitance is much lower in the depletion mode because of the insulating effect of the channel. Therefore, the capacitance varies significantly with the voltage. A capacitor with a high capacitance that is independent of the applied voltage allows for greater flexibility in circuit design.

Accordingly, it is desirable to provide integrated circuits including capacitors where the capacitance is less dependent upon the applied voltage, and methods of producing the same. In addition, it is desirable to provide integrated circuits with capacitors that have a high capacitance that remains substantially independent of the applied voltage, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing the same are provided. In an exemplary embodiment, an integrated circuit includes a first capacitor with a first gate overlying a first gate dielectric that in turn overlies a first channel. a second capacitor includes a second gate overlying a second gate dielectric that in turn overlies a second channel. The second gate dielectric has a different composition than the first gate dielectric. A capacitor interconnect is in electrical communication with the first capacitor and with the second capacitor.

An integrated circuit is provided in another embodiment. The integrated circuit includes a first capacitor with a first gate overlying a first gate dielectric that in turn overlies a first channel. The first gate dielectric has a first nitrogen concentration. A second capacitor includes a second gate overlying a second gate dielectric that in turn overlies a second channel. The second gate dielectric includes nitrogen at a second gate nitrogen concentration that is greater than the first gate dielectric nitrogen concentration. A capacitor interconnect electrically connects the first capacitor and the second capacitor in parallel.

A method of producing an integrated circuit is provided in yet another embodiment. The method includes forming first and second capacitors including first and second gates, first and second gate dielectrics, and first and second channels, respectively. The first and second gates overlie the first and second gate dielectrics, respectively, that in turn overlie the first and second channels, respectively. The second capacitor has a second capacitance/voltage curve that is modified by changing a second gate dielectric composition after forming the second gate dielectric and prior to forming the second gate. The first and second capacitors are electrically connected in parallel.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

An integrated circuit includes first and second capacitors that include first and second gates, gate dielectrics, channels, sources and drains. The first and second capacitors have capacitance/voltage curves with inflection points at about the transition point between a depletion and an inversion mode in the first and second channel, respectively. The capacitance is much higher on the inversion mode side of the inflection point. The first and second capacitors are also designed such that the capacitances in the depletion mode are about the same for each of the first and second capacitors, and the capacitances in the inversion mode may also be about the same. The first and second capacitors are electrically connected in parallel such that the electrically connected pair effectively has the capacitance of the sum of the first and second individual capacitances. The first and second capacitors are selected such that the change from inversion to depletion mode at the first and second inflection point is in the opposite direction, so one of the first and second capacitors changes from an inversion mode to a depletion mode and the other does the opposite, depending on the voltage. As such, the combined capacitance of the electrically connected first and second capacitors is more constant than that of either the first and second capacitor in isolation. A back plate bias voltage can be added to shift the inflection point for the first and/or second capacitor such that the first and second inflection points about match, thereby further reducing any variation in the combined capacitance.

Figure 1:
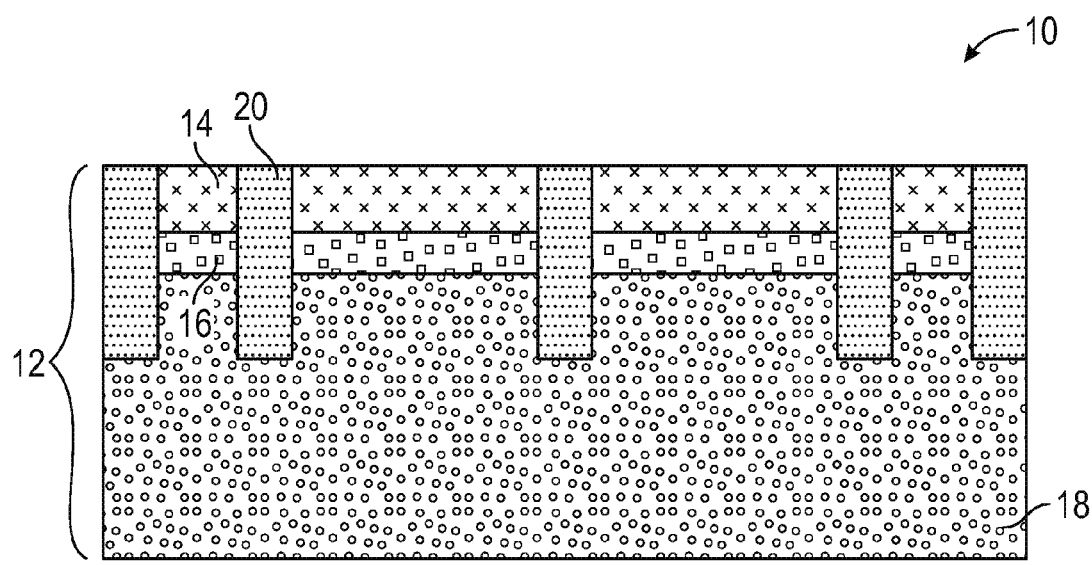
FIGS. 1-7 illustrate, in cross sectional views, an integrated circuit and methods for fabricating the same in accordance with exemplary embodiments.

Reference is made to an exemplary embodiment illustrated in FIG. 1. In an exemplary embodiment, the integrated circuit 10 includes a substrate 12, where the substrate 12 includes an active layer 14 overlying a buried insulator layer 16, and where the buried insulator layer 16 overlies a handle layer 18. As such, the illustrated substrate 12 is a semiconductor-on-insulator (SOI) substrate, sometimes referred to as a silicon-on-insulator substrate (especially for embodiments where the active layer primarily includes silicon). As used herein, the term "overlying" means "over" such that an intervening layer may lay between the active layer 14 and the buried insulator layer 16, or "on" such that the active layer 14 physically contacts the buried insulator layer 16. Moreover, the term "directly overlying" means a vertical line passing through the upper component also passes through the lower component, such that at least a portion of the upper component is directly over at least a portion of the lower component. It is understood that the integrated circuit 10 may be moved such that the relative "up" and "down" positions change, so reference to a "vertical" line means a line that is about perpendicular to the surface of the substrate 12. The substrate 12 may be a bulk wafer (not illustrated) in some embodiments, such as a monocrystalline silicon wafer.

In an exemplary embodiment, the active layer 14 and the handle layer 18 include semiconductive materials. As used herein, the term "semiconductor materials" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the active layer 14 is a monocrystalline silicon material, but other semiconductor materials may be used in alternate embodiments. The buried insulator layer 16 is silicon dioxide in an exemplary embodiment, but sapphire or other electrically insulating materials may also be used. The handle layer 18 provides mechanical strength and stability to the SOI substrate 12 and includes semiconductor materials, such as monocrystalline silicon in an exemplary embodiment. However, a wide variety of other semiconductor materials that provide mechanical strength and stability may be used in alternate embodiments. The use of semiconductor materials allows for incorporation of the handle layer 18 into some electronic components.

As used herein, an "electrically conductive" material generally has a resistivity of about $1 \times 10^{-4}$ ohm meters or less, an "electrically insulating" material generally has a resistivity of about $1 \times 10^{4}$ ohm meters or more, and "electrically semiconductive" materials have a resistivity of from less than about $1 \times 10^{4}$ ohm meters to more than about $1 \times 10^{-4}$ ohm meters. The term "electrical communication," as used herein, means electrical current is capable of flowing from one electrically conductive or semiconductive component to another, where the electrical current may or may not flow through an electrically conductive or electrically semiconductive intervening component. The term "direct electrical contact," as used herein, means direct physical contact between components that are electrically conductive or electrically semiconductive, but not electrical insulators.

One or more shallow trench isolation structures 20 are defined within the substrate 12. The shallow trench isolation structures 20 pass through the active layer 14 and the buried insulator layer 16, and extend into but not all the way through the handle layer 18. The shallow trench isolation structures 20 are electrically insulating structures, and may include silicon dioxide or other electrically insulating materials.

Figure 2:
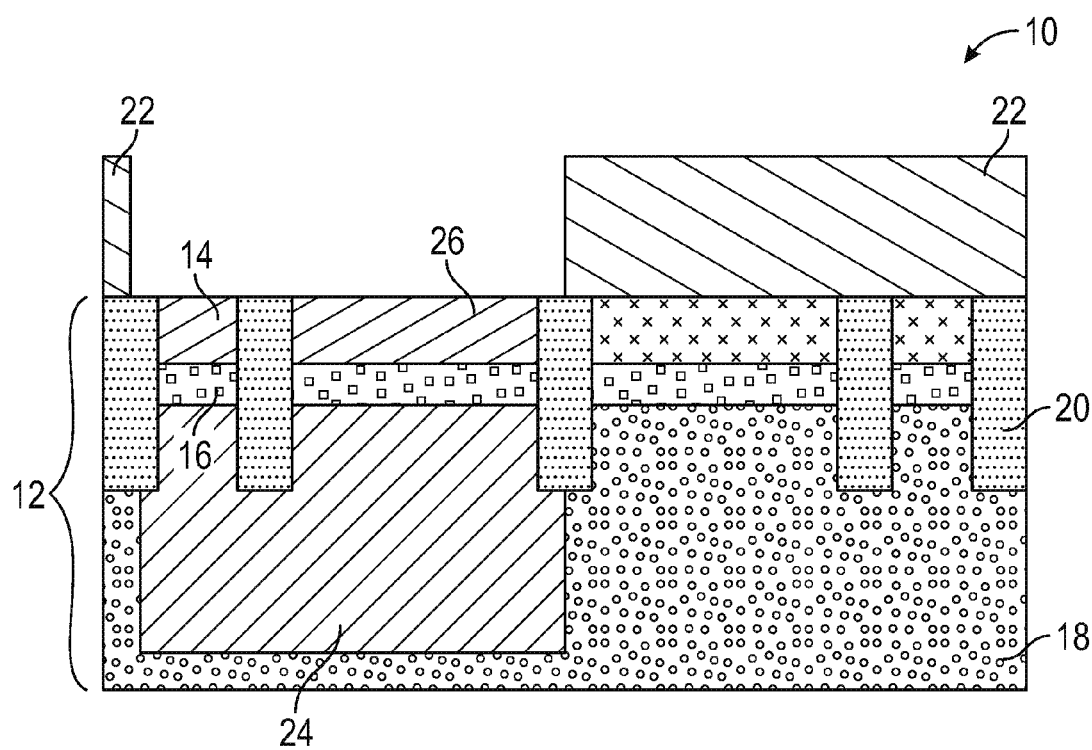

Referring to an exemplary embodiment illustrated in FIG. 2, a first photoresist layer 22 is formed and patterned overlying the substrate 12. The first photoresist layer 22 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the first photoresist layer 22 remains overlying the other areas of the substrate 12. The first photoresist layer 22 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane.

A first handle well 24 is formed in the handle layer 18, and a first active well 26 is formed in the active layer 14. The first handle and active wells 24, 26 may be formed by implanting conductivity determining impurities into selected locations of the active layer 14 and the handle layer 18. The conductivity determining impurities may be implanted by ion implantation through areas not covered by the first photoresist layer 22, or through exposed areas of a mask patterned from the first photoresist layer 22 (not illustrated). Ion implantation involves ionizing the conductivity determining impurities and propelling the ions into the substrate 12 under the influence of an electrical field. The strength of the electric field may determine the depth of the ion implantation, so the first handle well 24 may be formed by implanting the conductivity determining impurities through the active layer 14 and the buried insulator layer 16. The first active well 26 may be formed at the same time. The first handle well 24 may pass underneath one or more shallow trench isolation structures 20 in some embodiments, where the conductivity determining impurities may be implanted through shallow trench isolation structures 20. The substrate 12 may be annealed after the ion implantation to repair crystal damage and to electrically activate the conductivity determining impurities, such as at temperatures ranging from about 500 degrees centigrade (° C.) to about 1,200° C.

In an exemplary embodiment, the first handle well 24 and the first active well 26 include "N" type conductivity determining impurities, but the first handle well 24 and the first active well 26 may include "P" type conductivity determining impurities in alternate embodiments. "N" type conductivity determining impurities primarily include phosphorous, arsenic, and/or antimony, but other materials can also be used. "P" type conductivity determining impurities primarily include boron, aluminum, gallium, and indium, but other materials can also be used. The first handle well 24 and the first active well 26 may include P or N type conductivity determining impurities at a concentration of from about $1\times10^{15}$ to about $1\times10^{16}$ per cubic centimeter, but other concentrations are also possible. In some embodiments, the first handle well 24 and the first active well 26 may have different concentrations of conductivity determining impurities. The first photoresist layer 22 may be removed after use, such as with an oxygen containing plasma or with an appropriate solvent.

Figure 3:
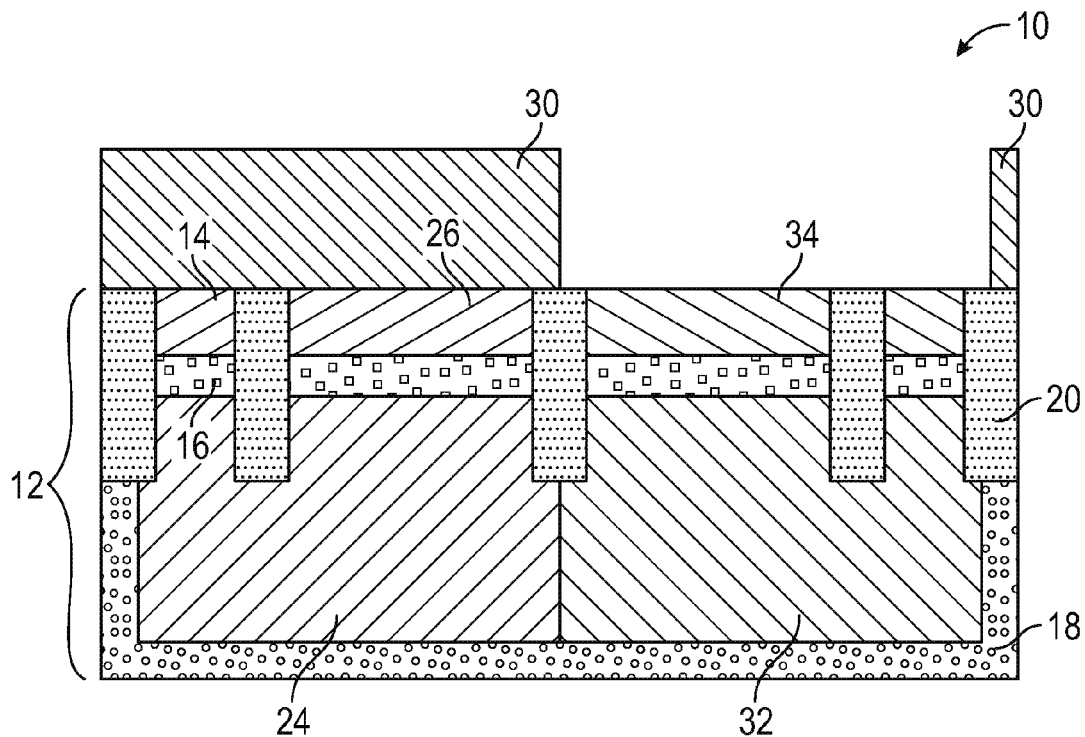

Referring to FIG. 3, a second photoresist layer 30 is used to form a second handle well 32 and a second active well 34 in a manner similar to that described above for the first handle and active wells 32, 34. In an exemplary embodiment, the second handle and active wells 24, 26 include "N" type conductivity determining impurities, so the first and second active wells 26, 34 have the opposite type of conductivity determining impurity. In alternate embodiments the first and second active wells 26, 34 have the same type of conductivity determining impurity, as described more fully below. The first and second handle wells 24, 32 may contact each other directly underlying a shallow trench isolation structure 20, and that shallow trench isolation structure 20 may be positioned between the first and second active wells 26, 34. However, in alternate embodiments, the first and second handle wells 24, 32, and the associated first and second active wells 26, 34 may be physically separated, and they may even be located in different parts of the integrated circuit 10. There is no need for the first and second handle and active wells 24, 32, 26, 34 to be adjacent to each other.

Figure 4:
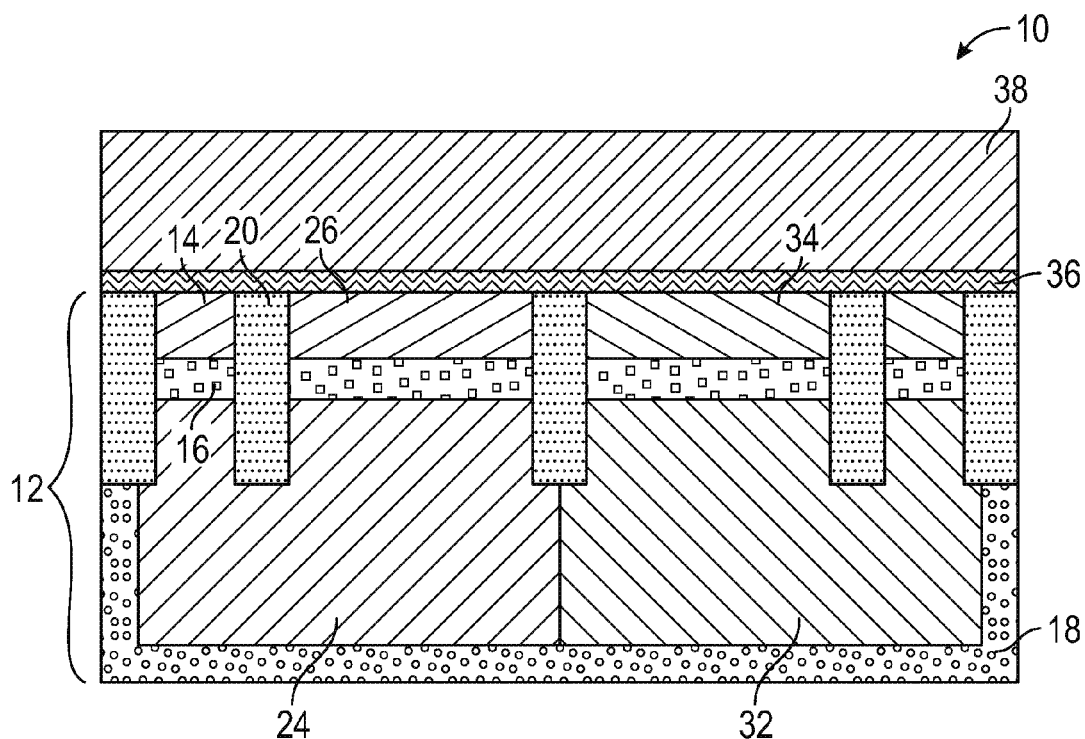

A gate dielectric layer 36 and a gate layer 38 may be formed overlying the substrate 12, as illustrated in an exemplary embodiment in FIG. 4. The gate dielectric layer 36 is an electrical insulator, and may include silicon dioxide, silicon oxynitride, or other electrically insulating materials in various embodiments. Silicon dioxide may be formed by thermal oxidation of the surface of the active layer 14 (for embodiments where the active layer includes silicon), or silicon dioxide may be deposited by chemical vapor deposition using silane an oxygen. The gate layer 38 is an electrical conductor or an electrical semiconductor, and may include polysilicon with conductivity determining impurities. Polysilicon can be formed by low pressure chemical vapor deposition in a silane environment, and ions of the desired conductivity determining impurity may be added as desired. In an exemplary embodiment, the conductivity determining impurities present in the gate layer 38 are the same type as in the first active well 26 for the overlying portion of the gate layer 38. The conductivity determining impurities present in the gate layer 38 are the same type as in the second active well 34 for the portion of the gate layer 38 overlying the second active well 34. As such, the gate layer 38 may be formed in separate portions, including one portion of the gate layer 38 with P type conductivity determining impurities and another portion of the gate layer 38 with N type conductivity determining impurities, where lithography is used to isolate the desired areas for each deposition.

Figure 5:
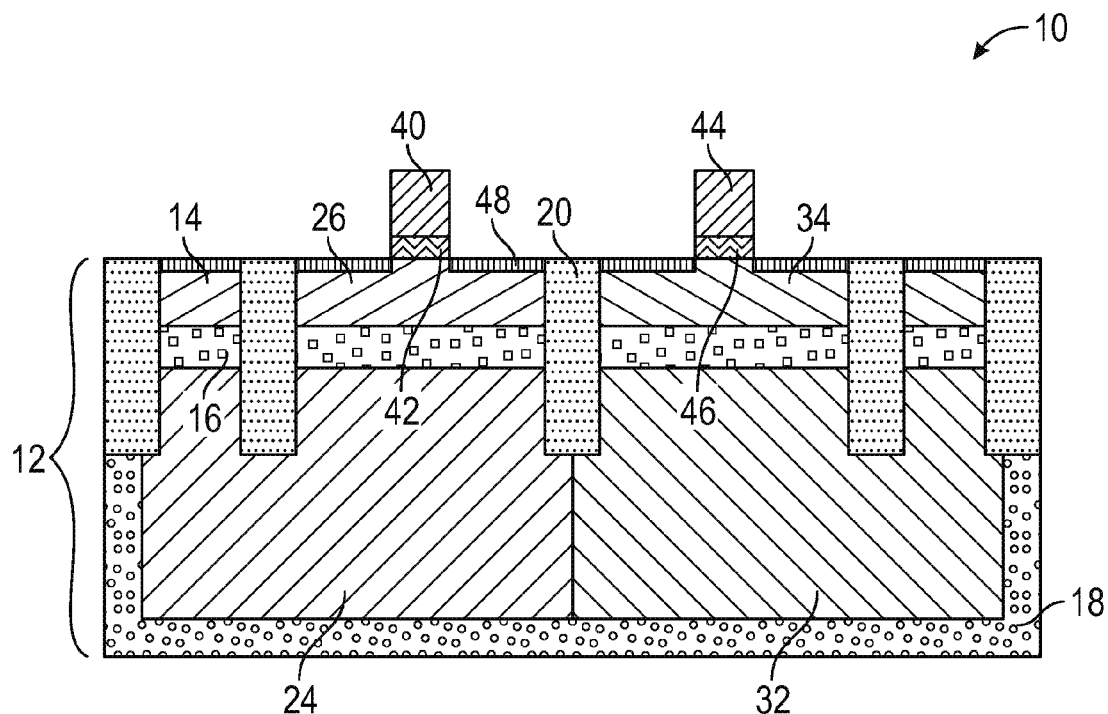

Referring to an exemplary embodiment in FIG. 5, with continuing reference to FIG. 4, a first gate 40, a first gate dielectric 42, a second gate 44, and a second gate dielectric 46 are formed. The first gate 40 and first gate dielectric 42 may overlie a portion of the first active well 26 that is positioned between two shallow trench isolation structures 20, with the second gate 44 and second gate dielectric 46 being positioned overlying a portion of the second active well 34 that is positioned between two shallow trench isolation structures 20. A layer of photoresist may be patterned to cover the area overlying the first and second gates 40, 44, and the remaining portions of the gate layer 38 may be removed, such as with an anisotropic reactive ion etch using hydrogen bromide. This forms the first and second gates 40, 44. The exposed portions of the gate dielectric layer 36 may then be removed, such as with an anisotropic reactive ion etch using hydrogen bromide and silicon tetrafluoride. An extension region 48 may then be formed in the active layer 14. The extension region 48 may include conductivity determining impurities within a shallow layer near the surface of the first and second active wells 26, 34 adjacent to the first and second gate dielectric 42, 46. The extension region 48 may include conductivity determining impurities of the same kind as those of the first and second active wells 26, 34, respectively. For example, if the first active well 26 includes N type conductivity determining impurities, the extension region 48 in the first active well 26 also includes N type conductivity determining impurities. If the second active well 34 includes P type conductivity determining impurities, the extension region 48 in the second active well 34 also includes P type conductivity determining impurities. Lithography may be used to selectively isolate and implant different types of conductivity determining impurities in the different extension regions 48.

Figure 6:
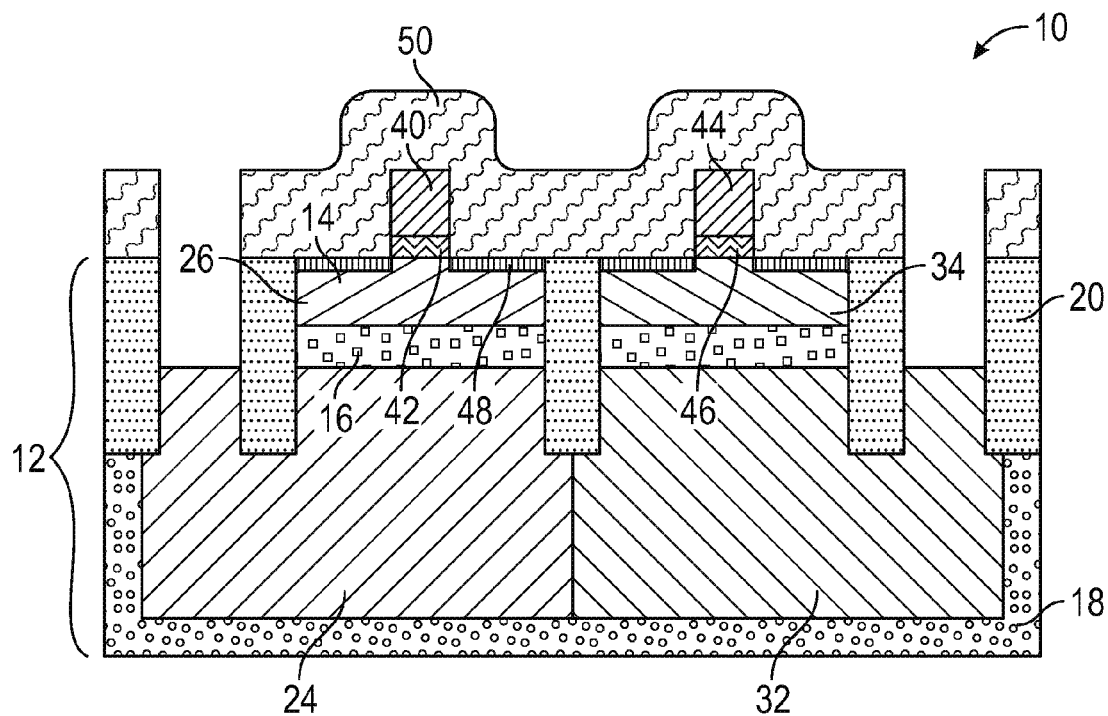

Referring to FIG. 6, a backend photoresist layer 50 may be formed and patterned to expose a portion of the active layer 14. The exposed portion of the active layer 14 may overlie the first handle well 24, but the first active well 26 with the overlying first gate 40 and first gate dielectric 42 may be covered, where a similar description applies to the second handle well 32. The exposed active layer 14 may be between different shallow trench isolation structures 20 than those around the first and second active wells 26, 34 with the overlying first and second gates 40, 44. The exposed active layer 14 and underlying buried insulator layer 16 may then be removed, such as with a reactive ion etch using silicon hexafluoride, while the covered portions are left as is. This leaves a portion of the first handle well 24 exposed, and another portion of the first handle well 24 covered by the buried insulator layer 16 and the first active well 26 with the associated first gate 40 and first gate dielectric 42. As such, a portion of the first handle well 24 may directly underlie the first active well 26 and the first gate 40, and the same first handle well 24 may pass underneath a shallow trench isolation structure 20 and extend to the exposed portion with no overlying buried insulator layer 16. A similar structure applies for the second handle well 32. The backend photoresist layer 50 is removed after use.

Figure 7:
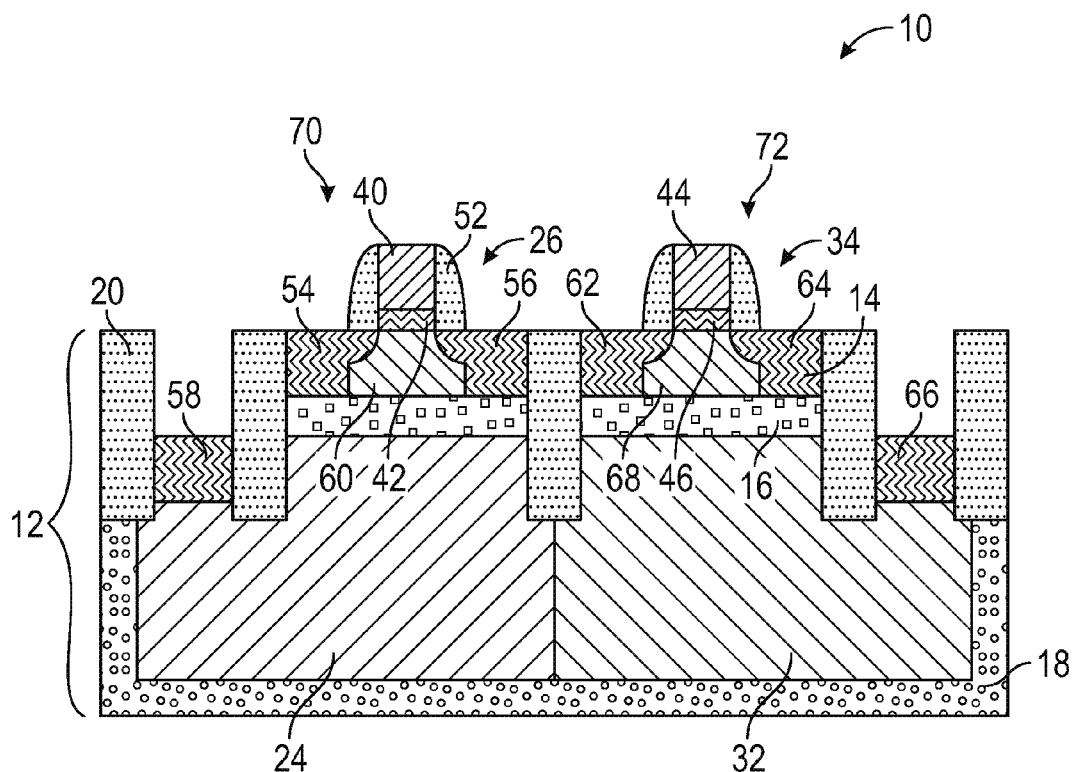

Spacers 52 may be formed adjacent to the first and second gates 40, 44, where the spacers 52 are electrically insulating, as illustrated in an exemplary embodiment in FIG. 7. In an exemplary embodiment, silicon nitride is blanket deposited followed by an anisotropic etch of the deposited silicon nitride, which leaves the vertical portions adjacent to the first and second gates 40, 44 as the spacers 52. Silicon nitride may be deposited by low pressure chemical vapor deposition using ammonia and silane, and a dry plasma etch with hydrogen and nitrogen trifluoride will anisotropically remove the silicon nitride. The silicon nitride anisotropic etch is stopped when the horizontal portions of the blanket deposited silicon nitride layer are removed, but before the spacers 52 are removed.

Conductivity determining impurities may then be implanted into the active layer 14 and the exposed handle layer 18. These conductivity determining impurities are the same type as in the first and second active wells 26, 34, respectively, and lithography may be used to isolate one type of active well while the other is implanted with conductivity determining impurities. These conductivity determining impurities form a first source 54 and a first drain 56 within the first active well 26, and a first handle well implant 58 in electrical communication with the first handle well 24. The first source 54 and first drain 56 are on opposite sides of the first gate 40, and a first channel 60 is defined within the first active well 26 between the first source 54 and the first drain 56 and underlying the first gate dielectric 42 and the first gate 40. As such, the first gate dielectric 42 electrically isolates the first gate 40 from the first active well 26 (including the first source 54, the first drain 56, and the first channel 60) to form a first capacitor 70. The first handle well implant 58 may be within the handle layer 18. In a similar manner, the second source 62, second drain 64, and second handle well implant 66 are formed, with the second source 62 and second drain 64 within the second active well 34 and on opposite sides of the second gate 44. A second channel 68 is defined within the second active well 34 between the second source 62 and the second drain 64 and underlying the second gate 44 and the second gate dielectric 46. As with the first capacitor 70, the second gate dielectric 46 electrically isolates the second channel 68 from the second gate 44 to form a second capacitor 72. The second handle well implant 66 is in electrical communication with the second handle well 32. The extension region 48 described above and illustrated in FIG. 5 may be incorporated into the first and second sources and drains 54, 56, 62, 64.

In the embodiment described above, the first capacitor 70 includes the first gate 40, the first channel 60, and the first gate dielectric 42, the first source 54 and the first drain 56, where the first source 54 and first drain 56 provide improved electrical contact points for the first channel 60. In the embodiment described above, the first gate 40, the first channel 60, the first source 54 and the first drain 56 all predominantly include N type conductivity determining impurities, so the first capacitor 70 is referred to as an N capacitor. Also, as described above, the second capacitor 72 includes the second gate 44, the second gate dielectric 46, the second channel 68, the second source 62 and the second drain 64, where the second source 62 and the second drain 64 improve electrical contact for the second channel 68. As described above, the second gate 44, the second channel 68, the second source 62, and the second drain 64 all predominantly include P type conductivity determining impurities, so the second capacitor 72 is referred to as a P capacitor. The N or P designation for the capacitor indicates the predominant conductivity determining impurity in the associated gate, channel, source and drain. It is to be appreciated that the first and second capacitors 70, 72 can be any combination of an N and/or a P capacitor in various embodiments, as described more fully below.

Silicides (not illustrated) may be formed to facilitate electrical contact on the first and second sources, drains, gates, and handle well implants 40, 44, 54, 56, 58, 62, 64, 68. In an exemplary embodiment, a thin layer of metal is deposited on the exposed surfaces, such as by sputtering or chemical vapor deposition, and the silicide is formed by a subsequent anneal. In an exemplary embodiment, nickel (Ni) is deposited and then annealed at a first temperature of about 240° C. to about 320° C. for about 10 to about 40 seconds, followed by a second anneal at about 400° C. to about 500° C. for about 20 to about 40 seconds. Other metals can be used, and the annealing process is adjusted for the selected metal. A wet etch is then used to selectively remove the nickel overburden, which does not react with materials other than silicon. For example, nickel can be selectively etched with a mixture of nitric acid, acetic acid, and sulfuric acid.

Figure 8:
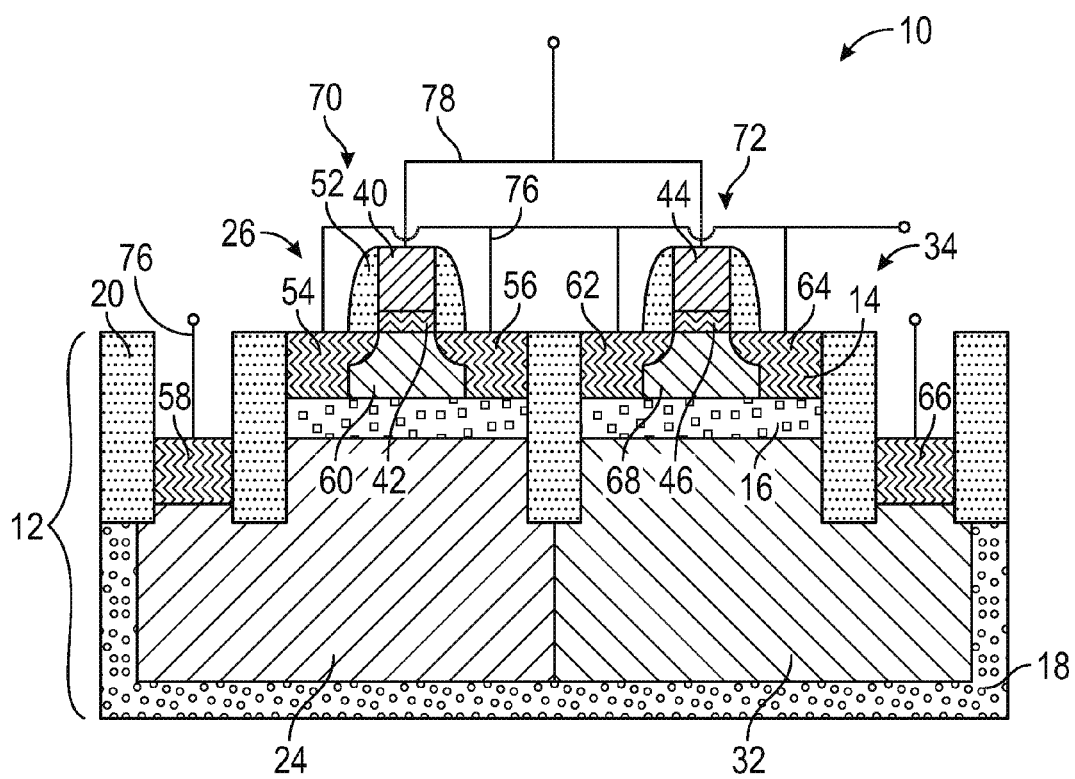
FIGS. 8, 11, 12, and 16 illustrate different embodiments of the integrated circuit and methods of producing the same, where a portion of FIGS. 8, 11, 12, and 16 are cross sectional views and where electrical connections are illustrated in schematic form.
Figure 9:
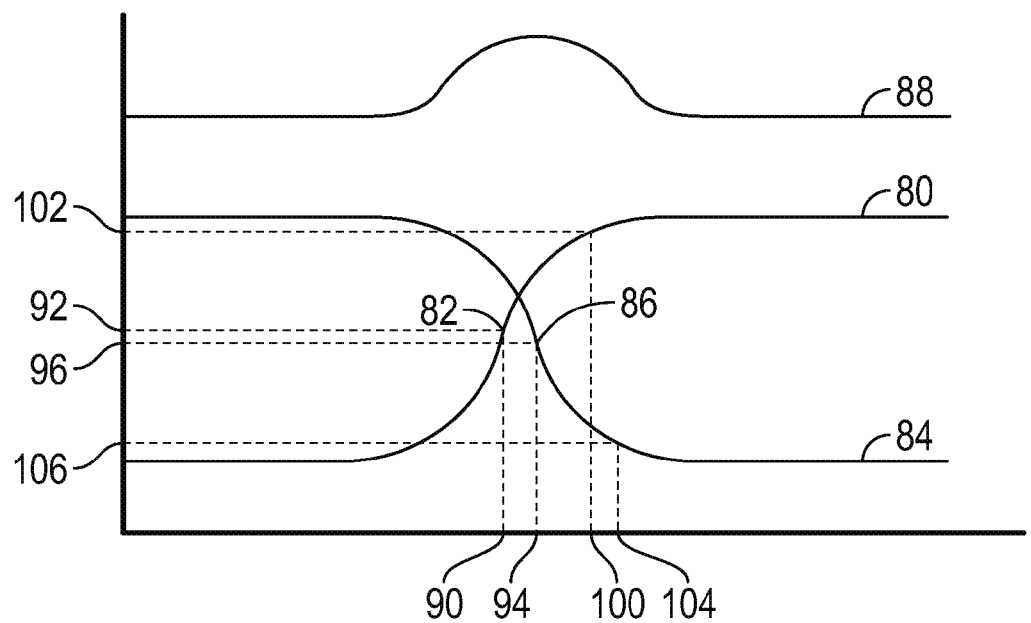
FIGS. 9 and 10 illustrated capacitance/voltage curves for different embodiments of the integrated circuit.

Referring to an exemplary embodiment in FIGS. 8 and 9, contacts 76 and capacitor interconnects 78 are formed to electrically connect the first and second capacitors 70, 72 in parallel. The contacts 76 are schematically illustrated as vertical lines and the capacitor interconnects 78 are schematically illustrated as horizontal lines in FIGS. 8, 11, and 12. The contacts 76 and capacitor interconnects 78 may be formed using typical back-end-of-the-line (BEOL) processes. The first and second channels 60, 68 are subject to electron inversion and depletion when a voltage is applied to the associated gate or the associated source and drain. As such, the first capacitor 70 has a first capacitance/voltage curve 80 with a first inflection point 82, and the second capacitor 72 has a second capacitance/voltage curve 84 with a second inflection point 86, as illustrated in FIG. 9. In FIG. 9, the horizontal axis (the X axis) is voltage and the vertical axis (the Y axis) is capacitance. The first and second inflection points 82, 86 are the points where the sign of the curvature (i.e., the concavity) of the first and second capacitance/voltage curves 80, 84 change. As such, the first capacitance/voltage curve 80 has a first inflection point voltage 90 and first inflection point capacitance 92 at the first inflection point 82, and the second capacitance/voltage curve 84 has a second inflection point voltage 94 and a second inflection point capacitance 96 at the second inflection point 86. The capacitance/voltage curve is an inherent feature of a capacitor. The inflection point of the capacitance/voltage curves described above results from the channel switching from an inversion mode to a depletion mode, or vice versa. As such, the described shape of the first and second capacitance/voltage curve 80, 84 is an inherent feature of a capacitor including a gate separated from a channel by a gate dielectric where the gate dielectric is thin enough for the channel to switch between inversion and depletion modes.

Portions of the first and second capacitance/voltage curve 80, 84 are at higher capacitances than at the first and second inflection points 82, 86, respectively. These portions with higher capacitance represent applied voltages where the first and second channels 60, 68, respectively, are in the inversion region. The portion of the first and second capacitance/voltage curve 80, 84 that is at a lower capacitance than at the first and second inflection point 82, 86 is the capacitance when the first and second channels 60, 68, respectively, are in the depletion region. The first and second capacitors 70, 72 are connected in parallel, so the pair has a combined capacitance/voltage curve 88 that represents the sum of the individual first and second capacitance/voltage curves 80, 84 at any given applied voltage.

The first and second capacitors 70, 72 may be formed using similar processes, so the first and second capacitance/voltage curves 80, 84 may be similar. However, in embodiments where the first capacitor 70 is an N capacitor and the second capacitor 72 is a P capacitor (or vice versa), the first and second capacitance/voltage curves 80, 84 are opposite, with one being in the inversion region at an applied voltage while the other is in the depletion region at the same applied voltage. Therefore, at a first applied voltage 100 greater than the first inflection point voltage 90, the first capacitance/voltage curve 80 has a first capacitance 102 that is greater than the first inflection point capacitance 92. In other words, the first capacitance 102 (of the first capacitor 70) increases as the first applied voltage 100 increases above the first inflection point voltage 90. In a similar manner, the first capacitance 102 decreases as the first applied voltage 100 decreases below the first inflection point voltage 90. However, at a second applied voltage 104 greater than the second inflection point voltage 94, the second capacitance/voltage curve 84 has a lower second capacitance 106 than the second inflection point capacitance 96. The second capacitance 106 (of the second capacitor 72) decreases as the second applied voltage 104 increases above the second inflection point voltage 94, which is the opposite as for the first capacitance/voltage curve 80. The first and second inflection point voltages 90, 94 may be within about 0.5 volts of each other in some embodiments.

In the embodiment illustrated in FIG. 8, the first and second gates 40, 44 are electrically connected together in parallel. In addition, the first and second sources and drains 54, 56, 62, 64 are electrically connected together in parallel. The opposite orientation of the first and second capacitance/voltage curves 80, 84 results in a much more stable combined capacitance/voltage curve 88, because the lower capacitance of one of the first and second capacitors 70, 72 (in the depletion region) is added to the higher capacitance of the other of the first and second capacitors 70, 72 (in the inversion region) to produce the combined capacitance/voltage curve 88. There may be some increase or decrease in the combined capacitance/voltage curve 88 near the voltage of the first and/or second inflection points 82, 86 because the first and second capacitance/voltage curves 80, 84 may not be perfectly aligned as mirror opposites.

Figure 10:
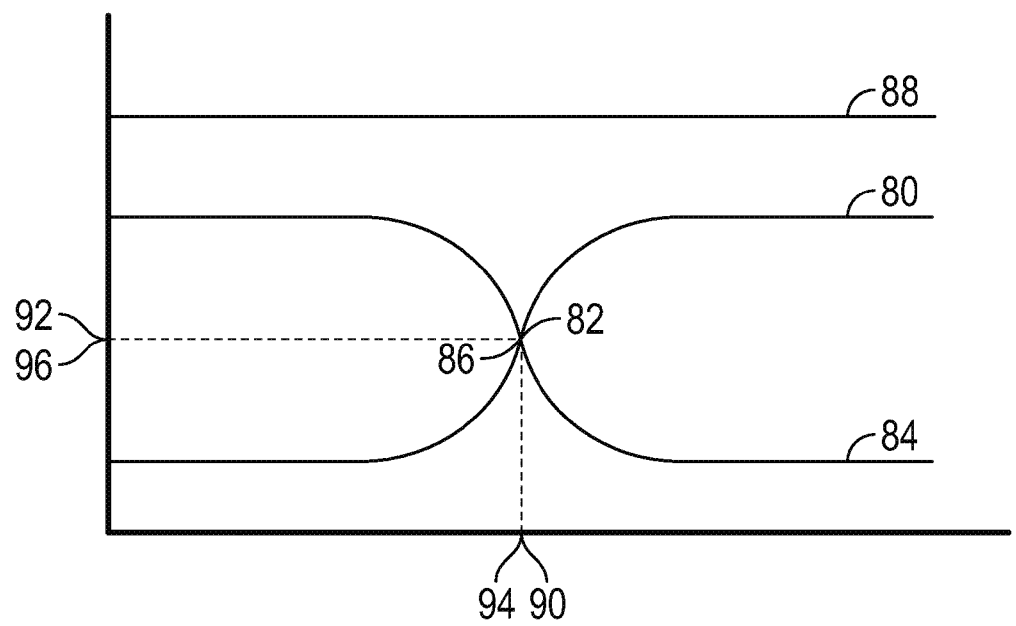

The first and/or second capacitance/voltage curves 80, 84 can be adjusted and tuned in a variety of manners. In an exemplary embodiment, the first and/or second capacitance/voltage curves 80, 84 are tuned by applying a back plate bias voltage to first and/or second handle well 24, 32. A contact 76 may be in electrical communication with the first handle well 24 and another contact 76 may be in electrical communication with the second handle well 32 to provide the back plate bias voltage to the first and/or second handle well 24, 32. The back plate bias voltage can shift the location of the first and/or second inflection point 82, 86, and in some examples a shift of about 0.2 votes in the first and/or second inflection points 82, 86 will produce a combined capacitance/voltage curve 88 that is about constant, such as a combined capacitance/voltage curve 88 that varies less than about 5% in a voltage range of from about −3 volts to about +3 volts, as illustrated in FIG. 10. The back plate bias voltage can be used to shift the first and/or second inflection points 82, 86 such that the first and second inflection point voltages 90, 94 are about the same voltage, and this can produce the combined capacitance voltage curve 88 that is about constant (varies less than about 5% in a voltage range of from about −3 to about +3 volts.)

Figure 11:
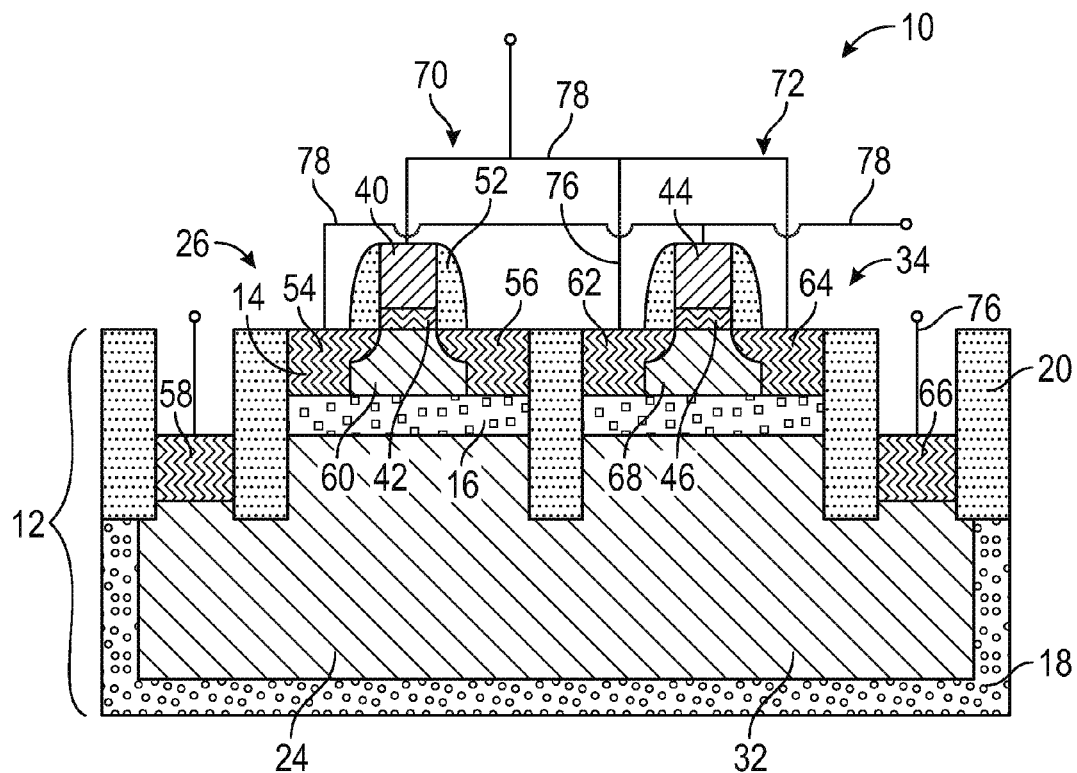
Figure 12:
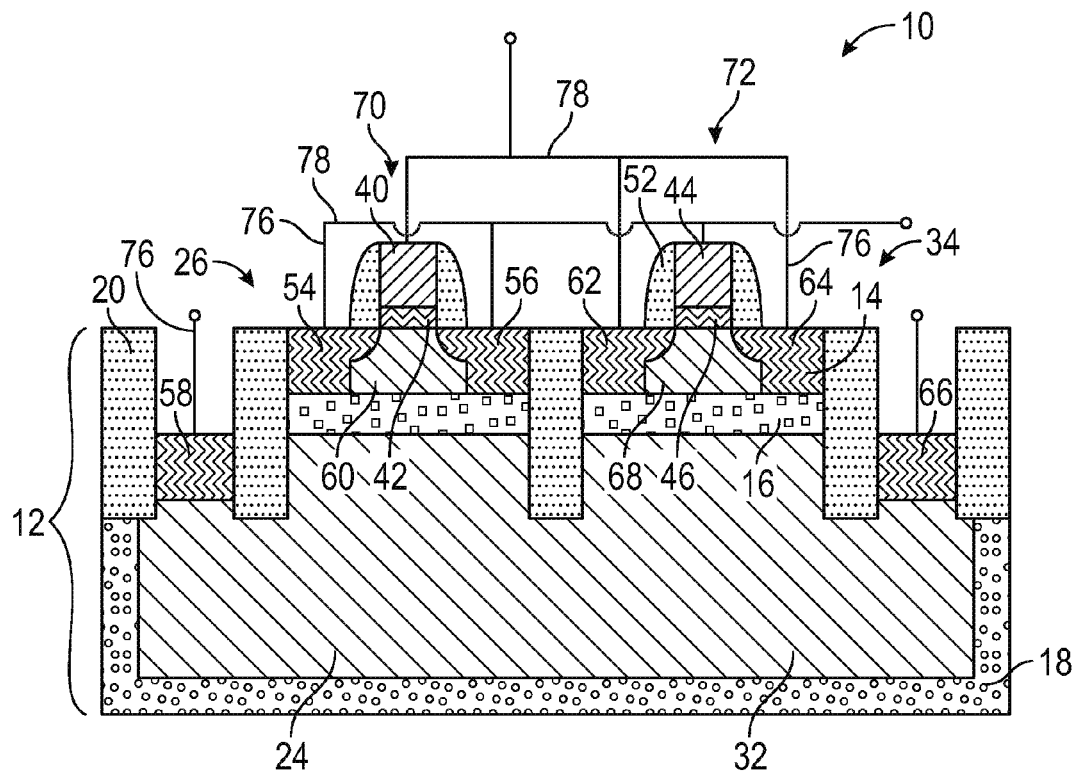

In the described embodiment, as illustrated in FIG. 8, the first capacitor 70 is an N capacitor, and the second capacitor 72 is a P capacitor. As such, the first and second gates 40, 44 are electrically connected in parallel, and the first and second sources and drains 54, 56, 62, 64 are electrically connected in parallel, as mentioned above. In an alternate embodiment, the first and the second capacitor 70, 72 are both P capacitors, as illustrated in FIG. 11. In yet another embodiment illustrated in FIG. 12, the first and second capacitors 70, 72 are both N capacitors. When the first and second capacitors 70, 72 are the same type of capacitor (N or P), the first capacitance/voltage curve 80 is about the same as the second capacitance/voltage curve 84. Therefore, in order to have the first channel 60 in one of the depletion or inversion regions when the second channel 68 is in the other of the depletion or inversion regions, the electrical connection to the first and second capacitors 70, 72 are switched. The first gate 40, the second source 62, and the second drain 64 may be electrically connected in parallel while the second gate 44, the first source 54, and the first drain 56 are electrically connected in parallel. This opposite type of connection (the gate from one capacitor with the source/drain of the other) reverses the capacitance/voltage curve for one of the first or second capacitors 70, 72 relative to the other. As such, the reversed first and second voltage/capacitance curves 80, 84 are obtained, as illustrated in FIG. 9.

A back plate bias voltage may improve capacitance consistency by tuning the location of the first and/or second inflection points 82, 86, but the first and second capacitors 70, 72 may both be N capacitors or P capacitors in some embodiments. The first and/or second inflection points 82, 86 may alternatively be adjusted and tuned by modifying the concentration of conductivity determining impurities in one or more of the first and second gate 40, 44 and/or the first and second channel 60, 68, or by other techniques.

A constant capacitance across a wide range of voltages allows for increased circuit design opportunities. The first and second capacitors 70, 72 as described above have a relatively thin dielectric layer between adjacent conductive or semi-conductive layers, so the first and second capacitors 70, 72 have a high capacitance relative to capacitors with thicker dielectric layers separating the conductive or semi-conductive plates. This reduces the footprint for a voltage-stable capacitor effect for integrated circuits.

Capacitors with different structures than as described above can be produced and combined to produce a combined capacitance/voltage curve 88 similar to that described above and illustrated in FIG. 10. An alternate embodiment of a first and second capacitor is described below, where comparable components described above are indicated with the same reference number except that the letter "A" is added to the reference numbers to indicate the alternate embodiment. In the embodiment described below the substrate is described and illustrated as a bulk silicon wafer that is free of a buried oxide layer, but a semiconductor-on-insulator (SOI) substrate can be used in alternate embodiments.

Figure 13:
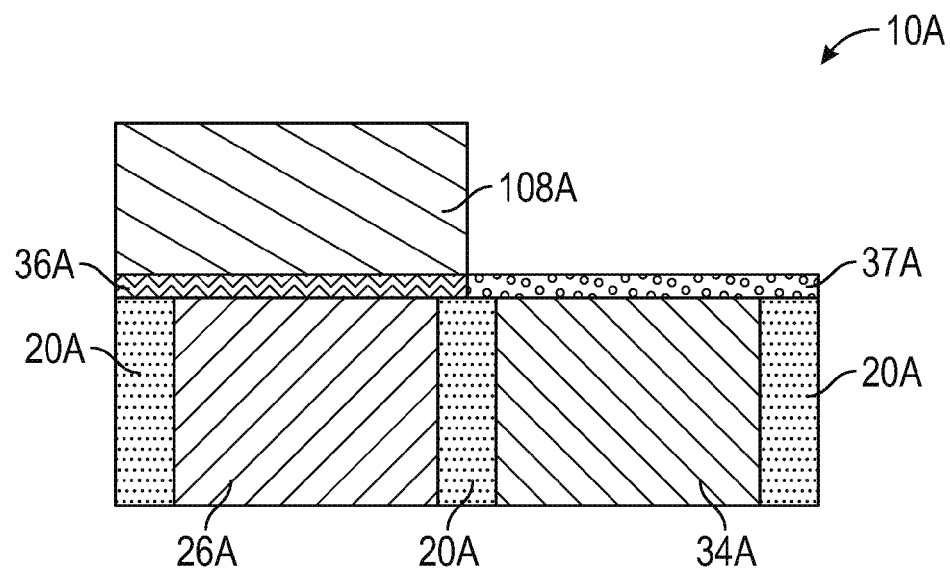
FIGS. 13-15 illustrate, in cross sectional views, an integrated circuit and methods for fabricating the same in accordance with an alternate embodiment that previously illustrated.

Reference is made to FIG. 13, where FIG. 13 illustrates the integrated circuit 10A at a production step comparable to that illustrated in FIG. 4 before the gate layer (item 38 in FIG. 4) is deposited. The integrated circuit 10A at this point includes shallow trench isolation structures 20A, a first well 26A (comparable to the first active well 26 in FIG. 4), a second well 34A (comparable to the second active well 34 in FIG. 4), and a gate dielectric layer 36A. In the illustrated embodiment, the first well 26A includes conductivity determining impurities that are primarily "N" type, and the second well 34A includes conductivity determining impurities that are primarily "P" type, but in alternate embodiments both the first well 26A and the second well 34A can each primarily include "N" or "P" type conductivity determining impurities independent of the other. So both the first and second wells 26A, 34A could be "N" wells, or both could be "P" wells, or either one could be an "N" well with the other being a "P" well.

A gate dielectric photoresist layer 108A is formed and patterned overlying the gate dielectric layer 36A to expose the gate dielectric layer 36A over the second well 34A while covering the gate dielectric layer 36A. The gate dielectric layer 36A includes silicon dioxide in an exemplary embodiment, as described above. The exposed gate dielectric layer 36A is implanted with impurities, such as nitrogen, to form an implanted gate dielectric layer 37A. Impurities other than nitrogen can be implanted in alternate embodiments. Nitrogen can be incorporated into the exposed, implanted gate dielectric layer 37A overlying the second well 34A in a variety of manners. In one example, the gate dielectric layer 36A is grown in a nitrous oxide and hydrogen ambient at about 950° C., then exposed to a low pressure plasma nitridation chamber using nitrous oxide, and then transferred under low pressure to a rapid thermal anneal in an oxygen ambient at about 900° C. More nitrogen is incorporated into the exposed implanted gate dielectric layer 37A overlying the second well 34A than the gate dielectric layer 36A underlying the gate dielectric photoresist layer 108A (and any associated hard masks and/or anti-reflective coatings, not illustrated, as described above).

Figure 14:
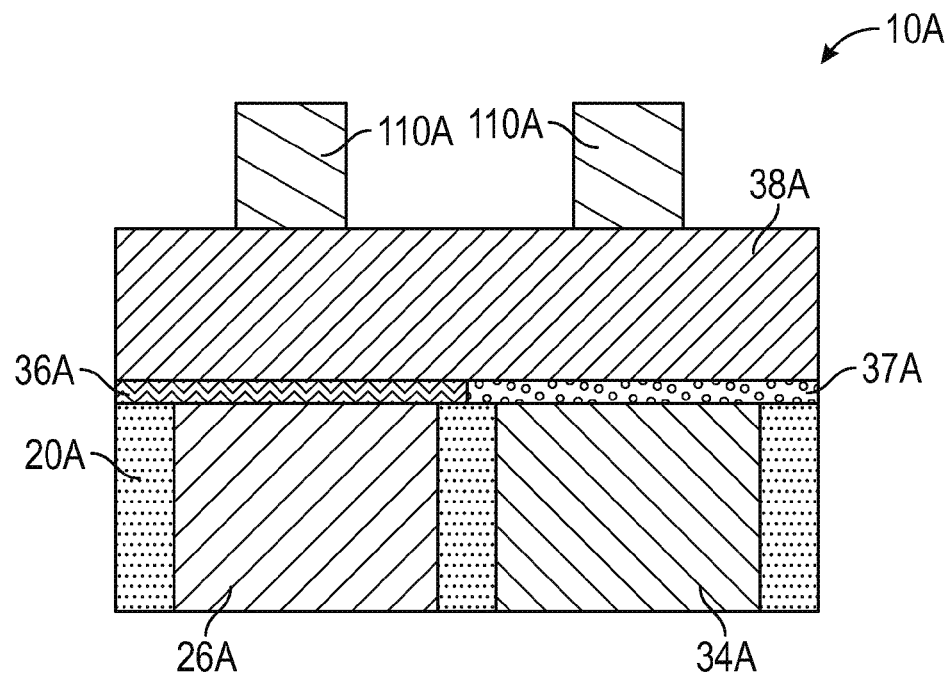

A gate layer 38A and a gate photoresist layer 110A are then formed overlying the gate dielectric layer 36A, as illustrated in an exemplary embodiment in FIG. 14, similar to the description above for FIG. 4. The gate layer 38A includes polysilicon in an exemplary embodiment. The processes described above for making a connection to the handle layer (24, 32 in FIG. 4) are omitted in embodiments without a buried oxide layer (16 in FIG. 4). The gate formation process, source and drain formation process, spacer formation process, etc. are then performed as described above.

Figure 15:
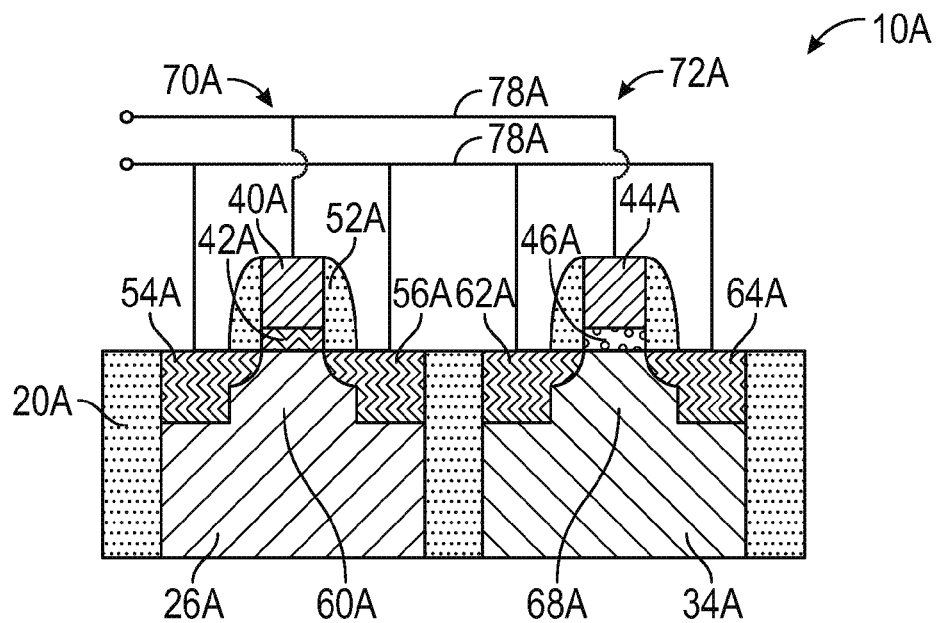

Reference is made to an exemplary embodiment in FIG. 15, with continuing reference to FIG. 14. A first gate dielectric 42A was formed from the gate dielectric layer 36A that was covered by the patterned gate dielectric photoresist layer 108A, and a second gate dielectric 46A was formed from the exposed gate dielectric layer 37A that was exposed by the patterned gate dielectric photoresist layer 108A. As such, the second gate dielectric 46A has a second gate dielectric nitrogen concentration that is greater than a first gate dielectric nitrogen concentration. The first gate dielectric nitrogen concentration can be as low as zero in some embodiments, where a concentration of "zero" is defined as non-detectable, but the first gate dielectric nitrogen concentration is detectable in alternate embodiments. The higher nitrogen concentration of the second gate dielectric 46A shifts the second capacitance/voltage curve 84 (illustrated in FIGS. 9 and 10, where the capacitance/voltage curves are the same for the described embodiment with the buried oxide layer (reference number 16 in FIG. 4) and the current embodiment illustrated in FIG. 15, so no additional figure with "A" reference numbers is needed or included).

The shifted second capacitance/voltage curve 84, relative to a capacitance/voltage curve with a gate dielectric layer that does not include additional nitrogen, produces a "flatter" combined capacitance/voltage curve 88, where a "flatter" combined capacitance/voltage curve 88 has less capacitance variation than the combined capacitance/voltage curve 88 without a shift in the second capacitance voltage curve 84. This shift in the second capacitance voltage curve 84 produces the same effect described above for the combined capacitance/voltage curve 84 (i.e., a flatter combined capacitance/voltage curve). Compound(s) other than nitrogen may be added to one or both of the first and/or second gate dielectric 42A, 46A in alternate embodiments to shift one or both of the first and second capacitance/voltage curves 80, 84 to produce a flatter combined capacitance/voltage curve 88. If one or more compounds are added to both the first and second gate dielectrics 42A, 46A, different compounds and/or different concentrations of the same or different compounds may be used in various embodiments.

In the illustrated embodiment where the first well 26A primarily includes "N" type conductivity determining impurities and the second well 34A primarily includes "P" type conductivity determining impurities (or vice versa), the first source 54A is in electrical communication with the first drain 56A, the second source 62A, and a second drain 64A, such as through a capacitor interconnect 78A. The first gate 38A is in electrical communication with the second gate 44A, such as through a capacitor interconnect 78A. In an exemplary embodiment, the capacitor interconnects 78A (and possibly other conductive components) electrically connect the first and second capacitors 70A, 72A in parallel to produce the combined capacitance/voltage curve 84.

Figure 16:
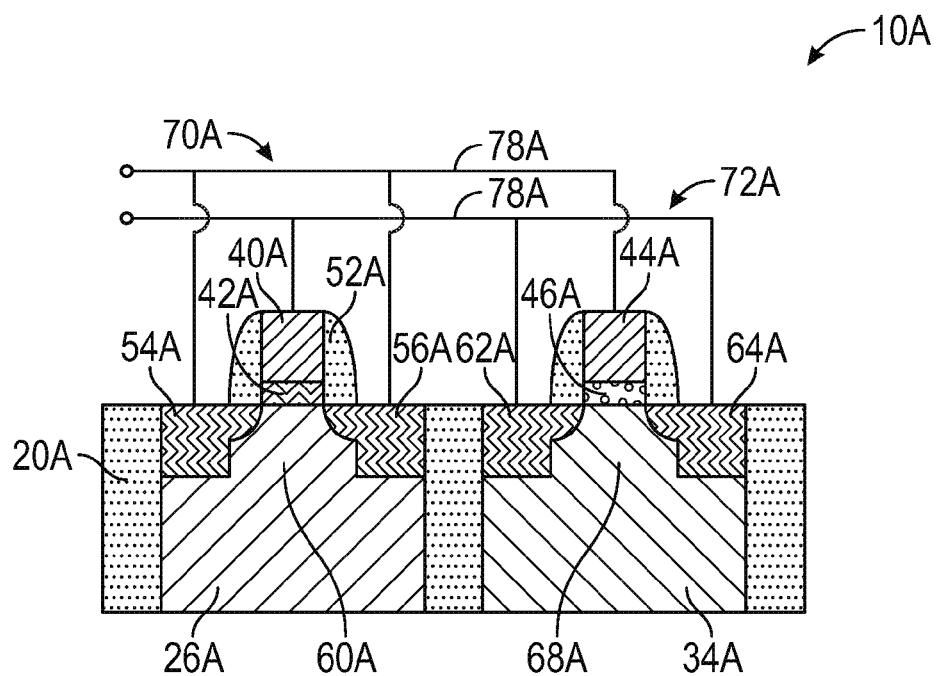

Also as described above and illustrated in FIG. 16, a first and second capacitor 70A, 72A where the first and second well 26A, 34A primarily have the same type of conductivity determining impurity can be used to produce a flatter combined capacitance/voltage curve 88. In such an embodiment, the first source 54A is in electrical communication with the first drain 56A and the second gate 44A, and the second source 62A is in electrical communication with the second drain 64A and the first gate 40A, such as through capacitor interconnects 78A.

While at least two exemplary embodiments have been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
a first capacitor comprising a first gate overlying a first gate dielectric, wherein the first gate dielectric overlies a first channel;
a second capacitor comprising a second gate overlying a second gate dielectric, wherein the second gate dielectric overlies a second channel, and wherein the second gate dielectric has a different composition than the first gate dielectric; and
a capacitor interconnect is in electrical communication with the first capacitor and with the second capacitor in parallel.

2. The integrated circuit of claim 1 wherein:
the first capacitor comprises a first source and a first drain;
the second capacitor comprises a second source and a second drain; and
wherein the first source is in electrical communication with the first drain and the second gate, and the second source is in electrical communication with the second drain and to the first gate.

3. The integrated circuit of claim 1 wherein:
the first capacitor comprises a first source and a first drain;
the second capacitor comprises a second source and a second drain; and
wherein the first source is in electrical communication with the first drain, the second source, and the second drain, and wherein the first gate is in electrical communication with the second gate.

4. The integrated circuit of claim 1 wherein:
the first capacitor has a first capacitance/voltage curve;
the second capacitor has a second capacitance/voltage curve; and
the capacitor interconnect electrically connects the first capacitor and the second capacitor to produce a combined capacitance/voltage curve.

5. The integrated circuit of claim 1 wherein:
the first gate dielectric primarily comprises silicon dioxide; and
the second gate dielectric primarily comprises silicon dioxide, and the second gate dielectric comprises nitrogen at a higher concentration than in the first gate dielectric.

6. The integrated circuit of claim 1 wherein:
the first capacitor comprises a first source and a first drain, wherein the first source and the first drain comprise conductivity determining impurities that are primarily "N" type conductivity determining impurities; and
the second capacitor comprises a second source and a second drain, wherein the second source and the second drain comprise conductivity determining impurities that are primarily "P" type conductivity determining impurities.

7. The integrated circuit of claim 1 wherein the integrated circuit is free of a buried oxide layer.

8. The integrated circuit of claim 1 wherein:
the first capacitor has a first capacitance/voltage curve with a first inflection point, wherein the first capacitance/voltage curve has a first inflection point voltage and a first inflection point capacitance at the first inflection point, wherein a first capacitance is measured at a first applied voltage greater than the first inflection point voltage, and wherein the first capacitance is greater than the first inflection point capacitance;
the second capacitor has a second capacitance/voltage curve with a second inflection point, wherein the second capacitance/voltage curve has a second inflection point voltage and a second inflection point capacitance at the second inflection point, wherein a second capacitance is measured at a second applied voltage that is greater than the second inflection point voltage, and wherein the second capacitance is less than the second inflection point capacitance; and
the capacitor interconnect produces a combined capacitance/voltage curve.

9. An integrated circuit comprising:
a first capacitor comprising a first gate overlying a first gate dielectric, wherein the first gate dielectric overlies a first channel, and wherein the first gate dielectric comprises a first gate dielectric nitrogen concentration;
a second capacitor comprising a second gate overlying a second gate dielectric, wherein the second gate dielectric overlies a second channel, and wherein the second gate dielectric comprises nitrogen at a second gate dielectric nitrogen concentration that is greater than the first gate dielectric nitrogen concentration; and
a capacitor interconnect electrically connecting the first capacitor and the second capacitor in parallel.

10. The integrated circuit of claim 9 wherein:
the first capacitor comprises a first source and a first drain;
the second capacitor comprises a second source and a second drain; and
the capacitor interconnect electrically connects the first source to the first drain and to the second gate, and the capacitor interconnect electrically connects the second source to the second drain and to the first gate.

11. The integrated circuit of claim 9 wherein:
the first capacitor comprises a first source and a first drain;
the second capacitor comprises a second source and a second drain; and
the capacitor interconnect electrically connects the first source to the first drain and to the second source and to the second drain, and the capacitor interconnect electrically connects the first gate to the second gate.

12. The integrated circuit of claim 9 wherein:
the first capacitor has a first capacitance/voltage curve;
the second capacitor has a second capacitance/voltage curve; and
the capacitor interconnect produces a combined capacitance/voltage curve.

13. The integrated circuit of claim 9 wherein:
the first capacitor comprises a first source and a first drain, wherein the first source and the first drain comprise conductivity determining impurities that are primarily "N" type conductivity determining impurities; and
the second capacitor comprises a second source and a second drain, wherein the second source and the second drain comprise conductivity determining impurities that are primarily "P" type conductivity determining impurities.

14. The integrated circuit of claim 9 wherein the integrated circuit is free of a buried oxide layer.

15. The integrated circuit of claim 9 wherein:
the first gate dielectric primarily comprises silicon dioxide; and
the second gate dielectric primarily comprises silicon dioxide.

16. The integrated circuit of claim 9 wherein:

the first capacitor has a first capacitance/voltage curve with a first inflection point, wherein the first capacitance/voltage curve has a first inflection point voltage and a first inflection point capacitance at the first inflection point, wherein a first capacitance is measured at a first applied voltage greater than the first inflection point voltage, and wherein the first capacitance is greater than the first inflection point capacitance;

the second capacitor has a second capacitance/voltage curve with a second inflection point, wherein the second capacitance/voltage curve has a second inflection point voltage and a second inflection point capacitance at the second inflection point, wherein a second capacitance is measured at a second applied voltage that is greater than the second inflection point voltage, and wherein the second capacitance is less than the second inflection point capacitance; and the capacitor interconnect produces a combined capacitance/voltage curve.

17. A method of producing an integrated circuit comprising:

forming a first capacitor comprising a first gate, a first gate dielectric, and a first channel, wherein the first gate overlies the first gate dielectric and the first gate dielectric overlies the first channel;

forming a second capacitor comprising a second gate, a second gate dielectric, and a second channel, wherein the second gate overlies the second gate dielectric and the second gate dielectric overlies the second channel, wherein the second capacitor has a second capacitance/voltage curve;

modifying the second capacitance/voltage curve by changing a second gate dielectric composition after forming the second gate dielectric and prior to forming the second gate; and electrically connecting the first capacitor and the second capacitor in parallel.

18. The method of claim 17 wherein:

forming the first capacitor comprises forming the first capacitor with a first capacitance/voltage curve; and electrically connecting the first capacitor and the second capacitor comprises producing a combined capacitance/voltage curve.

19. The method of claim 18 wherein:

modifying the second capacitance/voltage curve comprises decreasing a capacitance variation in the combined capacitance/voltage curve.

20. The method of claim 17 wherein:

forming the first capacitor comprises forming a first source and a first drain, wherein the first channel is between the first source and the first drain;

forming the second capacitor comprises forming a second source and a second drain, wherein the second channel is between the second source and the second drain; and electrically connecting the first capacitor and the second capacitor in parallel comprises electrically connecting the first source to the second source and to the second gate, and electrically connecting the second source to the second drain and the first gate.

* * * * *